US005708268A

United States Patent [19]
Franzen

[11] Patent Number: 5,708,268
[45] Date of Patent: Jan. 13, 1998

[54] METHOD AND DEVICE FOR THE TRANSPORT OF IONS IN VACUUM

[75] Inventor: Jochen Franzen, Bremen, Germany

[73] Assignee: Bruker-Franzen Analytik GmbH, Bremen, Germany

[21] Appl. No.: 644,044

[22] Filed: May 9, 1996

[30] Foreign Application Priority Data

May 12, 1995 [DE] Germany ........................ 195 17 507.7

[51] Int. Cl.$^6$ ............................ B01D 59/44; H01J 49/00; H01J 37/10

[52] U.S. Cl. ........................ 250/292; 250/282; 250/396 R

[58] Field of Search .................................... 250/281, 282, 250/292, 396 R

[56] References Cited

U.S. PATENT DOCUMENTS

| | | | |
|---|---|---|---|
| 4,861,988 | 8/1989 | Henion et al. | 250/282 |
| 4,990,777 | 2/1991 | Hurst et al. | 250/292 |
| 5,572,035 | 11/1996 | Franzen | 250/292 |
| 5,576,540 | 11/1996 | Jolliffe | 250/282 |

*Primary Examiner*—Bruce Anderson

[57] ABSTRACT

The invention relates to methods and devices for the efficient and loss-free transfer of ions in moderate vacuum from a first location (a source) to a second location (a user).

The invention consists of an arrangement, reaching from the first location to the second, of five pole rods (a pentapole) to which a five-phase radio frequency (RF) voltage is applied.

10 Claims, 2 Drawing Sheets

METHOD AND DEVICE FOR THE TRANSPORT OF IONS IN VACUUM

The invention relates to methods and devices for the efficient and loss-free transfer of ions in moderate vacuum from a first location (a source) to a second location (a user).

The invention consists of an arrangement, reaching from the first location to the second, of five pole rods (a pentapole) to which a five-phase radio frequency (RF) voltage is applied.

PRIOR ART

According to prior art there are already various devices for ion transportation which are adapted to ambient pressure conditions.

In ultra-high vacuum (UHV) it is possible to transport ions in ion guides which consist of an outer tube and an inner thin wire stretched along the axis. A potential difference between the wire and the tube creates an electrical field arrangement in which the ions can be transported along the axis of the tube, whereby the ions perform ellipsoidal movements round the wire. Normally they cannnot touch neither the wire nor the wall of the pipe. Ions which do not by chance hit the center wire when being introduced to the ion guide can therefore be transported in the ion guide for any length of time or, if reflectors are used at the ends, be stored there. They can only be lost by a number of collisions with residual gas which deflect the ions so that they eventually hit the wire.

In an inferior vacuum where a moderate number of collisions with residual gas molecules dampen the movement of ions such an ion guide cannot be used. However, here it is possible to successfully guide ions with linear RF multipole rod arrangements as invented by Wolfgang Paul because they build up electrical RF fields which accelerate the ions toward the axis of the arrangement. However, along the axis there exists no metal wire on which ions can discharge after damping their radial movement.

The RF multipole arrangements always consist of an even number of pole rods. A two-phase RF voltage is applied in such a manner that there is always a phase changeover of 180° between adjacent pole rods. The arrangements are frequently referred to as two-dimensional multipole arrangements because in each cross section perpendicular to the axis the same field distribution prevails at each moment in time.

If the number of pole rods can be divided by four, the fields are referred to as even multipole fields (quadrupole, octopole, dodecapole, etc.). If it is even but cannot be divided by four, the fields are referred to as uneven multipole fields (dipole, hexapole, decapole, etc.). Multipole fields always have an angular symmetry. They are characterised by the fact that at all points the field consists of an amplitude value which temporally follows the same cosine function. Therefore the field can always be split into two factors, of which one defines the spatial amplitude function and the other the temporal change in the form of a cosine function. All the complex multipole fields which satisfy this requirement can be represented by the addition of simple multipole fields; the multipole fields form a complete orthogonal system.

An arrangement made of an uneven number of pole rods has not yet become known.

DISADVANTAGES OF THE PRIOR ART

So far quadrupole, hexapole and octopole systems have been used for the transfer of ions from a source to a user. They are all operated by a two-phase RF voltage.

Of these multipole systems it is the quadrupole system which is the best, if the ions have to be collected in the center to form a pointed source of ions at the end of the device. The ions gather in the center of its parabolic pseudo potential well, even if potential disturbances occur due to the space charge created by large numbers of ions. On the other hand, however, compared with higher multipole systems operated with the same voltage and frequency, the quadrupole system has the lowest retroactive force and the lowest depth of the pseudo potential well so it can store only a very limited number of ions.

Assuming the same potential conditions, the octopole system can collect by far the largest number of ions. However, the ions collect not along the axis, as is the case with the quadrupole system, but in a cylindrical surface, the radius of which depends on space charge. At the center there are then only very few ions. The pseudo potential well has the shape of a parabola of the fourth order, and substantially retroactive forces only occur in the vicinity of the pole rods. This system has considerable disadvantages if the ions, upon emerging from the end of the system, must have a small point of origin for further ion-optical focusing. Focusing of the emerging ions is scarcely possible. The size of the point of origin depends on the number of ions inside the octopole arrangement The hexapole system has so far provided the best compromise. Here too, however, there will be a considerable widening of the point of origin of the emerging ions if there is a high number of ions.

OBJECTIVE OF THE INVENTION

It is the objective of the invention to find a method and a device with which ions in a vacuum can be transferred efficiently from one location (a "source") to an other location (a "user" or "sink"), whereby a favorable reduction of phase space should be possible which, as is known (according to Liouville's law) cannot be achieved by strictly ion-optical means. It should therefore be possible to collect the ions, even in high numbers, along the axis of the device by dampening their movement in order to provide the user with as pointed a source of ions as possible with as little scatter of initial energy as possible. Also it should be possible to remove undesirable ions from the device below the mass threshold. In addition it should be possible to store ions temporarily if the user only takes ions cyclically.

IDEA OF THE INVENTION

It is the basic idea of the invention to use a pentapole system for guiding the ions. The pentapole system according to this invention consists of five pole rods to which a five-phase RF voltage is applied. However, the voltages of consecutive phases are not applied to adjacent pole rods but skip one pole rod each time. Since these rod systems are supplied with voltages of several hundred volts only (at frequencies between one and ten megahertz) which can be generated directly with low-cost high-voltage transistors without the use of costly transformers, generation of the five-phase RF voltage is no longer a major disadvantage, particularly if the five phases of the RF can be controlled and produced digitally.

This arrangement does not constitute a multipole field in the classical sense. It cannot be defined by a superposition of simple multipole fields. The field cannot be split up into an amplitude function and a time function as with a classical multipole field because the cosine function has different phases at different points on the cross section.

As with multipole systems, the pentapole system shows zero potential along the central axis if the phases of the five-phase RF voltage are uniformly distributed with angles of 72° between each other and if the rods are uniformly distributed on a cylindrical surface.

This arrangement provides a narrow pseudo potential well with a sharply pronounced minimum which is scarcely different from that of a quadrupole system. On the other hand, the well is deeper under equivalent voltage conditions and more ions can be collected. The motion of the ions can, as with conventional multipole systems, be dampened by collisions with a residual gas or damping gas, whereby the phase space of the ions is reduced.

A higher uneven number of pole rods (7, 9, and so on) can also be used but then the voltage supply becomes more complex in proportion to the number of pole rods, and the potential well at the center becomes shallower and wider. The pentapole system is the first and simplest storage system among the rod systems with an uneven number of pole rods. Use of a tripole rod system for the purpose of this invention is not possible. Along the axis of a tripole rod system an instable equilibrium exists. Ions outside the axis are accelerated out of the system. There is a certain similarity with the simplest multipole field, the dipole field, which is the only multipole field not capable of storing (or guiding) ions.

Ions below a mass-to-charge threshold set by voltage and frequency are eliminated from the system because these ions do not have stable trajectories in the pentapole arrangement This effect is known from the multipole arrangements.

As known from multipole arrangements, the pentapole arrangement has the advantage that ions can be stored in it if the user does not extract the ions continuously. For storage it is necessary to provide the pentapole arrangement with reflecting electric fields at both ends, which can, for instance, easily be generated by two apertured diaphragms at an appropriate voltage.

The pentapole arrangement also has the advantage that the oscillations of the admitted or stored ions are subjected to a twist due to the rotation of the RF field, supporting the damping of ion motion by collisions with the residual gas.

PARTICULARLY FAVORABLE EMBODIMENTS

Figure 1:
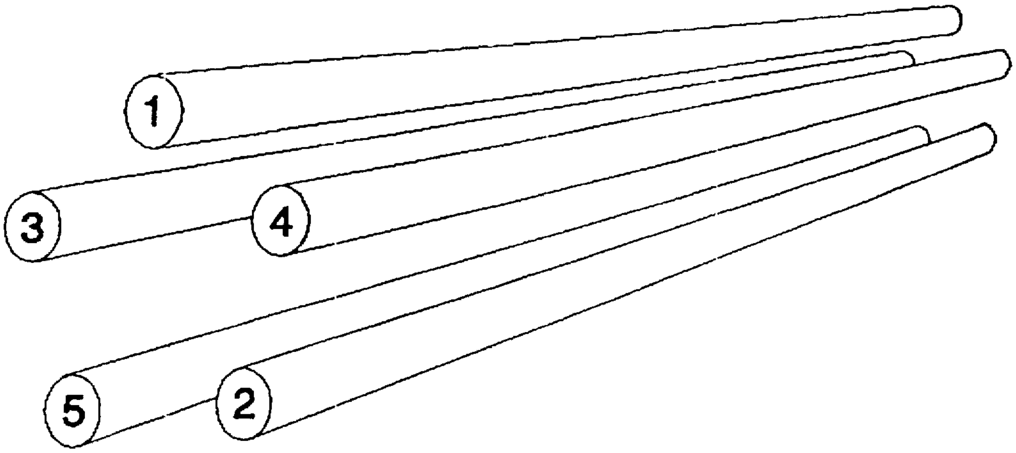
FIG. 1 shows an ion grade of pentapole design. The sequence of phases of the RF voltage to be applied is indicated by the numbers written on the ends of the rods. The (necessary) rod holders are not shown to provide a better illustration.
Figure 2:
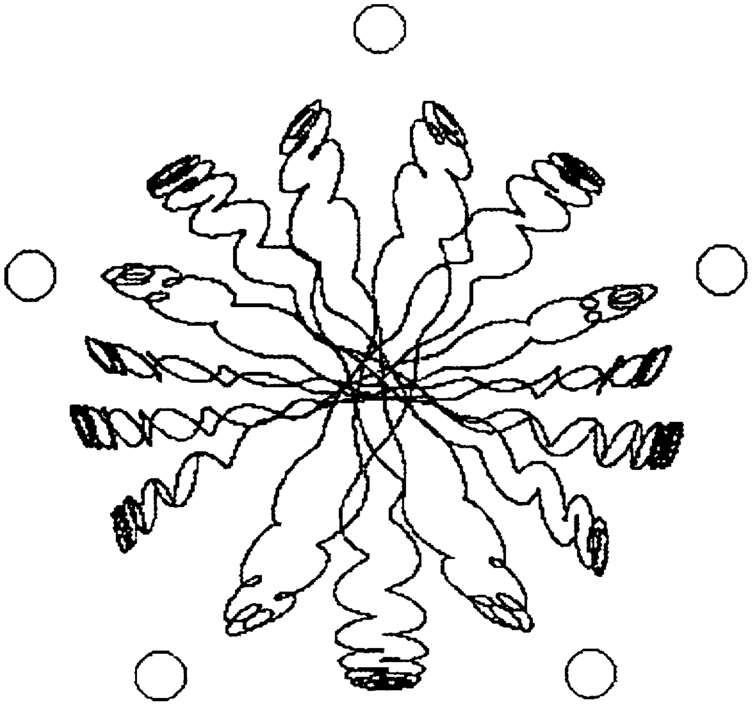
FIG. 2 shows the radial component of an undamped ion trajectory in a pentapole. The ion was introduced exactly at the center but with a velocity component in the radial direction which was such that the ion could just be stably collected. The figure shows the large stability range within the pole rods and the twist which is imparted upon a particle's movement by the five-phase RF voltage. In the case of damping the radial motion collapses more and more with each collision and the particle eventually comes to rest at the center. It is then only disturbed by further collisions with the damping gas.
Figure 3:
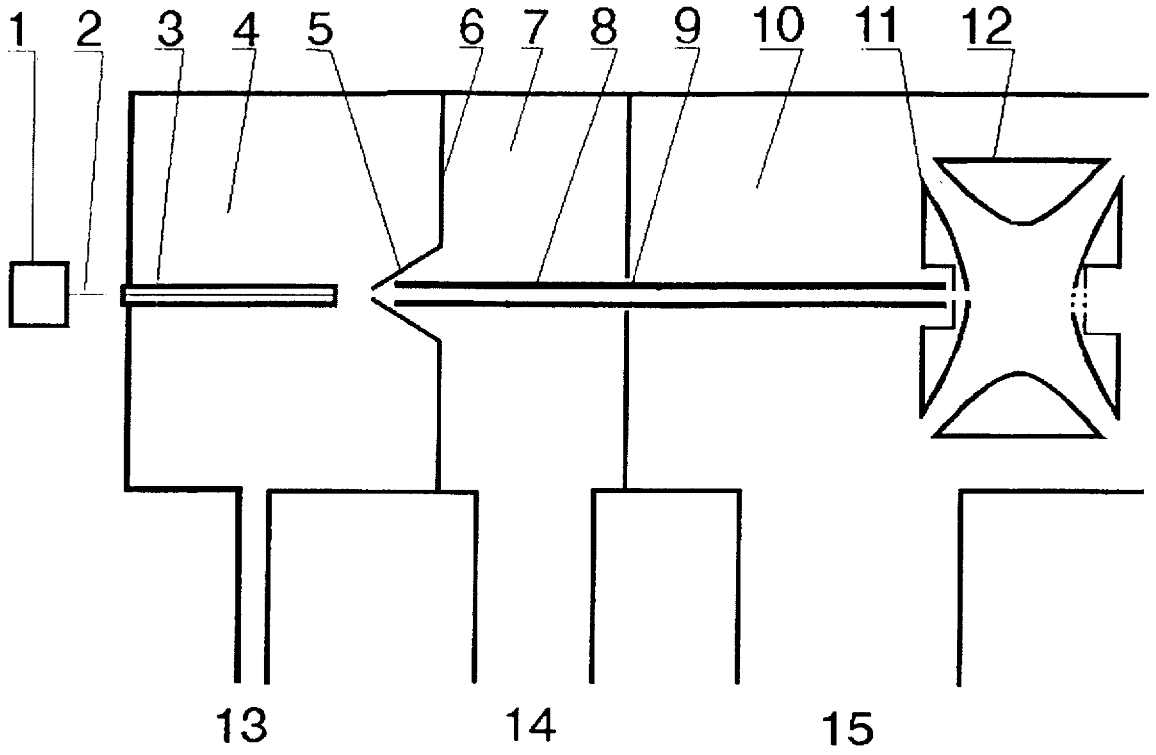
FIG. 3 shows an example of how to use a pentapole ion guide. It is an arrangement which comprises a vacuum-external electrospray ion source and transfers the ions to an ion trap mass spectrometer. The supply tank (1) contains a liquid which is sprayed by electric voltage between a free spray capillary (2) and the end of an entrance capillary (3). The ions pass through the entrance capillary (3) together with ambient air into a first differentially pumped chamber (4), which is connected to a fore-pump via a flange (13). The ions are accelerated toward the skimmer (5) and pass through the opening in the skimmer (5), which is located in wall (6), into the second chamber (7) of the differential pumping system. This chamber (7) is connected to a high vacuum pump by the pump pipe (14). The ions passing the opening in the skimmer (5), forming the source location, are caught by the pentapole ion guide (8) and taken through the wall opening (9) and the main vacuum chamber (10) to the end cap (11) of the ion trap, forming the user location. The ion trap consists of two end caps and the ring electrode (12). The main vacuum chamber is connected to a high vacuum pump via pump nozzle (15).

The embodiment described here relates to an ion generator which consists of an out-of-vacuum electrospray ion source (1), an entrance capillary (3), a fast differential pumping stage (4) with a gas skimmer (5) opposite the entrance capillary (3). Consequently the "first location" or "source" according to the invention is the hole in the gas skimmer (5). Ions pass through this hole into the pentapole device with large angular divergence and a large spread of energy.

The embodiment also relates to a mass spectrometer in the form of an RF quadrupole ion trap (11, 12), which is to be understood as the "second location", "user" or "sink" according to this invention. An RF quadrupole ion trap consists of a ring electrode (12) and two end cap electrodes (11). The introduction of ions takes place through a hole in one of the end caps.

However, application of the invention should not be restricted to this arrangement—for other types of sources or users any expert can easily make the appropriate modifications.

An ion trap mass spectrometer is only filled with ions during a short time in each measuring cycle. This is generally followed by a damping period in which the ions are collected in a small cloud at the center of the ion trap. If a normal mass spectrum is to be scanned, it is followed by a period in which the ions are ejected from the ion trap mass by mass and measured with a measuring device. Ejection generally takes place through that end cap of the ion trap which is opposite the injection end cap. For other operating modes, e.g. MS/MS, further periods of ion isolation and fragmentation are inserted. The filling period is therefore generally short compared with the total of the other periods. The ions generated in the ion source during this time are usually rejected and are lost to analysis. With the pentapole ion guide it is possible to store these ions temporarily and use them for analysis.

The embodiment described here is illustrated with an electrospray ion source (1, 2) outside the vacuum housing of the mass spectrometer. However, the invention should explicitly, as already indicated above, not be restricted to this type of ion generation. The ions are obtained in an electrospray ion source (1) by spraying fine droplets of a liquid in air (or in nitrogen) from a fine capillary (2), applying a strong electric field, whereby the droplets evaporate and leave their charge on detached molecules. In this way it is easy to ionize very large molecules.

The ions from this ion source are usually introduced to the vacuum of the mass spectrometer through a capillary (3) with an inside diameter of about 0.5 millimeters and a length of about 100 millimeters. They are swept along by the simultaneously admitted air (or by a different gas which is admitted to the entrance area) by gas friction. A differential pumping system with two intermediate stages (4 and 7) handles the evacuation of the flow of gas. The ions admitted through the capillary are accelerated in the first chamber (4) of the differential pumping system in the adiabatically expanding gas jet and are dram by an electric field toward the opposite opening of a gas skimmer (5). The gas skimmer (5) is a conical tip with a center hole, whereby the outer wall of the cone deflects the flow of gas outward. The opening in the gas skimmer admits the ions, now with much less accompanying gas, into the second chamber (7) of the differential pumping system.

Just behind the opening in the skimmer (5) the ion guide (8) begins. According to the invention this consists of a pentapole system (FIG. 1) which here is comprised of five thin, straight rods which are evenly arranged around the perimeter of a cylinder. However, it is also possible to use the curved ion guide with bent pole rods, e.g. to very efficiently eliminate neutral gas. The rods are supplied with a five-phase RF voltage, whereby the phases alternate by 144° between adjacent rods. The rods are held at several points by isolating devices which are not shown in FIG. 1.

The particularly favorable embodiment has rods which are 150 millimeters long and have a diameter of 1 millimeter, whilst the cylindrical guiding compartment has a diameter of 3 millimeters. The ion guide is therefore very slim. Experience indicates that the ions which are admitted through a skimmer hole with a diameter of 1.2 millimeters are collected by the ion guide with virtually no losses if their masses are above the cutoff threshold. This unusually good catching rate is chiefly due to the gas-dynamic conditions within the skimmer hole at the entrance opening of the pentapole system.

At a frequency of about 2 megahertz and a voltage of about 100 volts all the singly charged ions with masses above 40 atomic mass units are focused in the ion guide. Lighter ions leave the ion guide. If higher voltages or lower frequencies are used, the cutoff threshold for the ion masses can be increased to any values.

The pentapole ion guide (8) extends from the opening in the gas skimmer (5), which is arranged as part of the wall (6) between the first chamber (4) and the second chamber (7), through this second chamber (7) of the differential pumping system, then through a wall opening (9) into a vacuum chamber (10) of the mass spectrometer up to the entrance of the ion trap in the end cap (11). Due to the slim design of the ion guide the wall opening (9) can be kept very small so that the pressure difference can be kept favorably high. The wall in the ion trap end cap (11) with the injection hole for the ions, which has a diameter of 1.5 millimeters, serves as the first ion reflector, whilst the other ion reflector is formed by the gas skimmer (5) with its throughhole having a diameter of 1.2 millimeters.

By changing the axial potential of the ion guide (8) in relation to the potentials of the skimmer (5) and the wall of the ion source (11) the ion guide (8) can be used as a storage device for ions of a single polarity, i.e. either for positive or negative ions. The axial potential is identical to the zero potential of the five-phase RF voltage. The stored ions run constantly to and fro in the ion guide (8). Since they acquire a velocity of about 500 to 2,000 meters per second or more in the adiabatic acceleration phase when leaving the entrance capillary, they initially pass over the length of the ion guide several times per millisecond. Their radial oscillation in the ion guide depends on the angle of injection.

However, since the ions periodically return to the second chamber (7) of the differential pumping system, in which there is a pressure of about $10^{-3}$ millibar, the radial oscillations are very quickly damped and the ions collect along the axis of the ion guide..Their longitudinal motion is also decelerated to thermal velocities. Therefore, the ions have a thermal velocity distribution after a short time, although it has an impressed joint velocity component toward the ion trap (11, 12), which stems from collisions with the continuously flowing gas through the hole in the skimmer.

If one wishes to be able to empty the storage ion guide (8) very quickly into the ion trap, one can impart upon the ions a constant additional thrust toward the ion trap by making the guide compartment slightly conical, e.g. with a diameter of 2 millimeters at the entrance end, rising to 4 millimeters at the ion trap end. However, the cordcity decreases the cutoff threshold for the ion masses very considerably towards the end of the device.

By changing the axial potential it is possible to make the stored ions flow off into the ion trap. Reverse flow into the chamber (4) is almost completely prevented by the numerous collisions with the inflow of gas. Reverse flow can also be prevented by asymmeuic potentials across the two ion reflectors, the skimmer (5) and the wall of the ion trap (11).

It is the operating conditions of the ion source which determine whether all the ions temporarily stored are transferred into the ion trap or not. The ion source can particularly be coupled to devices for sample separation, e.g. with capillary electrophoresis. Capillary electrophoresis then provides temporally separated substances in very short periods of time with a high concentration. Intermediate storage of the ions can then be very favorably used to store the ions of a substance for several ion trap fillings, whereby several different MS/MS analyses of daughter ion spectra of various parent ions are made possible. Even MS/MS/MS analyses with grand-daughter ion spectra can be performed; the latter are of special interest for the aminoacid sequence analysis of proteins. Electrophoresis can easily be interrupted for longer analysis times by switching the electrophoretic voltage off in the meantime.

However, ion sources which are located inside the vacuum housing of the mass spectrometer can quite clearly also be connected to ion traps via storage ion guides based on the principle of this invention. Here too, the ions from temporally separated substance peaks, as occur when coupled with chromatographic or electrophoretic methods, can be stored in the ion trap for several analyses.

The RF quadrupole ion traps do not necessarily have to function as mass spectrometers. For example, they can serve to collect ions for time-of-flight spectrometers, concentrate them into a dense cloud, and then outpulse them into the flight path of the time-of-flight spectrometer. It is also possible to initially isolate certain desirable ions in the ion trap before outpulsing them or to fragment them, thus obtaining MS/MS measurements in time-of-flight spectrometers. The advantage of time-of-flight spectrometers is their large mass range and their fast scanning.

The transfer of ions from an ion source to an ion cyclotron resonance mass spectrometer can also be advantageously illustrated with pentapole ion guides based on this invention. The ICR spectrometer is subject to working pulses which are similar to those of an RF quadrupole ion trap so the storage capability of the ion guide in the analysis phases is a great advantage. Thermalisation of the ions also has an advantageous effect. The ion guide here generally does not extend up to the storage cell of the spectrometer and it is the magnetic field in this case which handles the further guidance of the ions.

I claim:

1. RF ion guide system, consisting of parallel, electrically conductive pole rods, for the transportation of ions in a vacuum from a first to a second location, with devices for generating the RF voltages supplied to the pole rods, wherein the rod system consists of five pole rods, and wherein a five-phase RF voltage is used, each phase connected to one of the five pole rods, whereby the voltages of consecutive phases are not applied to adjacent rods.

2. Device as in claim 1, wherein the five pole rods are symmetrically and evenly distributed around the surface of a cylinder.

3. Device as in claim 2, wherein the pole rods have a diameter of between 0.5 and 5 millimeters and enclose an empty space with a diameter of 1 to 10 millimeters.

4. Device as in claim 2, wherein the five phases of the rotational voltage have the same phase spacing of $2\pi/5=72°$ in each case.

5. Device as in claim 2, wherein the five-phase RF voltage is between 50 and 1,000 volts and the frequency is between 500 kilohertz and 10 megahertz.

6. Device as in claim 2, with means of maintaining a higher pressure in parts of the five rod system, wherein ion motion in these parts is damped by the higher pressure of the damping gas.

7. Device as in claim 2, with terminal apertures and a voltage supply for the apertures, wherein the ions are stored by reflecting potentials at the terminal apertures, at least temporarily.

8. Method for transferring ions in a vacuum from a first to a second location with the aid of an RF ion guide system, wherein the ion guide system consists of five parallel pole rods, and wherein a phase of a five-phase RF voltage is applied to each pole rod, whereby the voltages of consecutive phases are not applied to adjacent rods.

9. Method as in claim 8, wherein the ion movement is damped by a gas, at least in a part of the five pole rod system.

10. Method as in claim 8, wherein the ions are stored by reflecting electric fields at the ends of the five pole system, at least temporarily.

* * * * *